United States Patent [19]

Yamada et al.

[11] Patent Number: 4,583,019
[45] Date of Patent: Apr. 15, 1986

[54] PIEZOELECTRIC RESONATOR USING 165° Y-CUT LINBO₃

[75] Inventors: Sumio Yamada; Yoshiro Fujiwara; Noboru Wakatsuki, all of Kawasaki; Yuji Kojima, Chigasaki, all of Japan

[73] Assignee: Fujitsu Limited, Kawasaki, Japan

[21] Appl. No.: 613,187

[22] Filed: May 23, 1984

[30] Foreign Application Priority Data

| May 30, 1983 | [JP] | Japan | 58-095265 |
| Jul. 22, 1983 | [JP] | Japan | 58-133748 |
| Jul. 28, 1983 | [JP] | Japan | 58-138278 |

[51] Int. Cl.⁴ .......................................... H01L 41/08
[52] U.S. Cl. ................................. 310/360; 310/318; 310/348
[58] Field of Search ............... 310/360, 348, 344, 367, 310/320

[56] References Cited

U.S. PATENT DOCUMENTS

| 3,461,408 | 8/1969 | Onoe et al. | 310/360 X |
| 3,591,813 | 7/1971 | Coquin | 310/360 X |
| 3,858,065 | 12/1974 | Epstein | 310/360 X |
| 4,124,809 | 11/1978 | Engdahl et al. | 310/320 X |
| 4,283,650 | 8/1981 | Koyama et al. | 310/344 |
| 4,384,229 | 5/1983 | Inoue et al. | 310/320 X |
| 4,454,444 | 6/1984 | Fujiwara et al. | 310/360 |

OTHER PUBLICATIONS

Determination of Elastic and Piezoelectric Constants for Crystals in Class (3m), by Warner, Onoe & Coquin, JASA, vol. 42, No. 6, 1967, pp. 1223-1229.

Primary Examiner—Mark O. Budd
Attorney, Agent, or Firm—Staas & Halsey

[57] ABSTRACT

A piezoelectric resonator with a rectangular parallelepiped resonator. A lithium niobate single crystal is used as the resonator chip material. Each of the opposed main surfaces of the resonator chip is arranged to be a surface of a rotated Y-cut plate which is rotated 165±5 degrees about an X-axis. The angle of the longitudinal direction of the resonator chip is arranged to be 90±5 degrees with respect to the X-axis of the rotated Y-cut plate.

15 Claims, 26 Drawing Figures

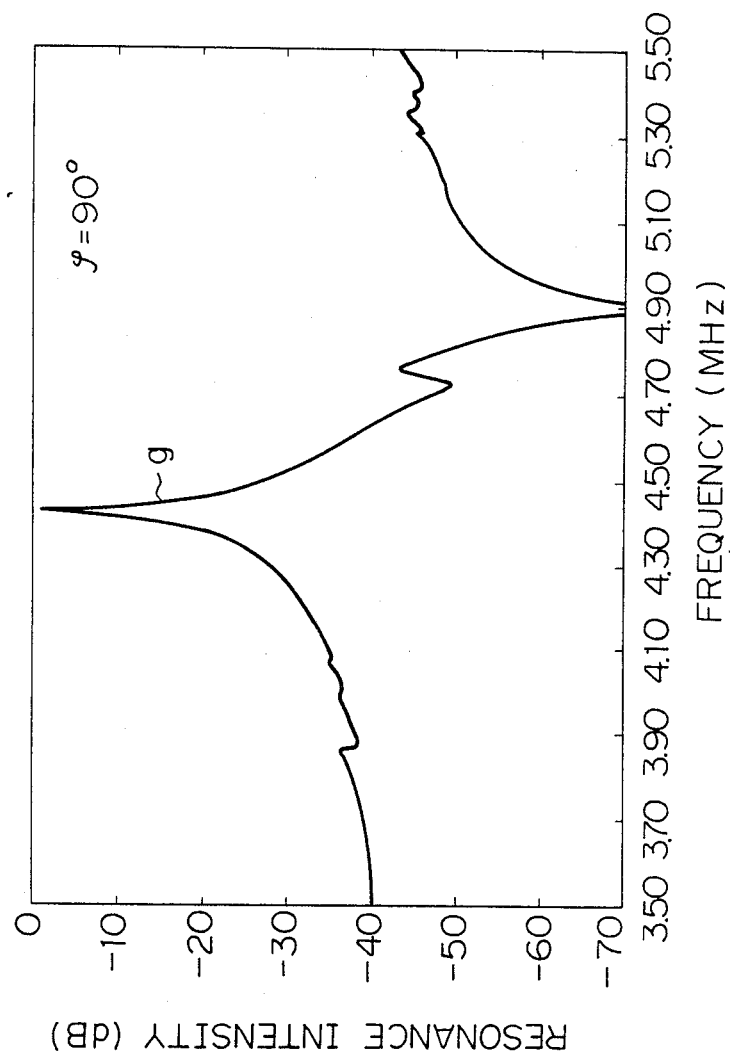

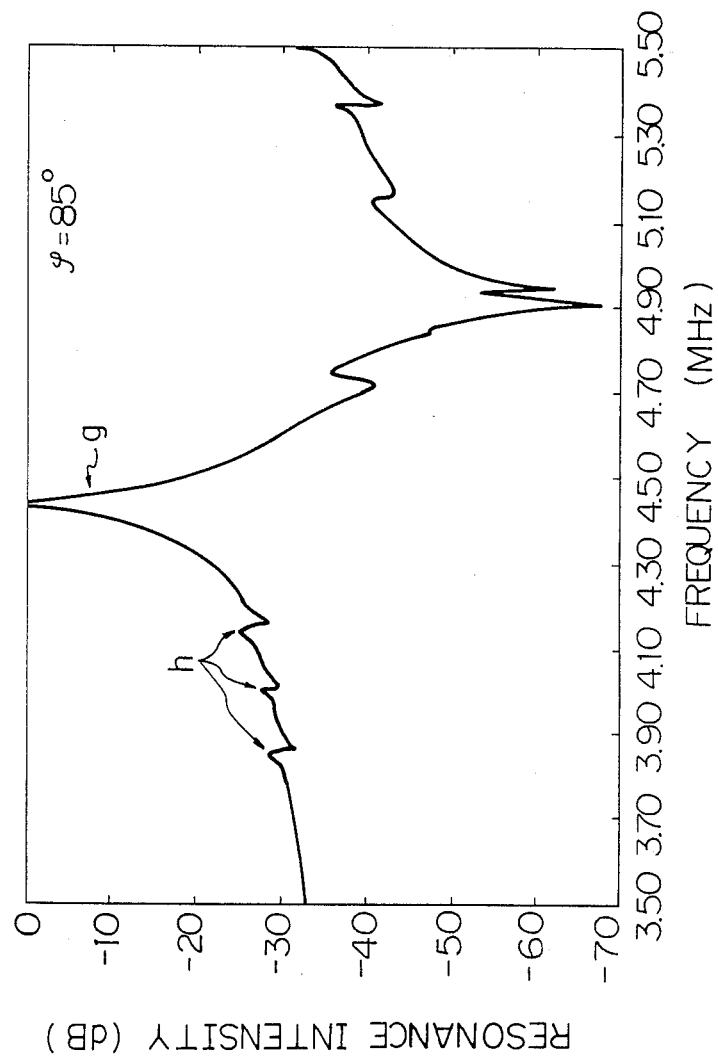

PIEZOELECTRIC RESONATOR USING 165° Y-CUT LINBO₃

BACKGROUND OF THE INVENTION

The present invention relates to a piezoelectric resonator, more particularly to improvements in a piezoelectric resonator using a lithium niobate (LiNbO₃) single crystal.

A piezoelectric resonator comprising a quartz (rock crystal) resonator chip is used in an oscillator circuit or a filter circuit of various electronic apparatuses. Recently, a piezoelectric resonator chip using lithium tantalate (LiTaO₃) instead of quartz has been developed to obtain a small size piezoelectric resonator with a high stability, since lithium tantalate has a high electro-mechanical coupling coefficient and stable temperature characteristic. A strip type resonator element using the lithium tantalate resonator chip is known, in which the resonator chip is formed in a rectangular parallelepiped shape and an electrode is provided on the center portion of each of the upper and the lower surfaces and over the entire width of the chip, to obtain a smaller size piezoelectric resonator and minimize the generation of spurious waves. The applicant has proposed a strip type resonator element comprising a lithium tantalate resonator chip in which the crystal axes are taken into consideration so that the lithium tantalate wafer is made of a three degree rotated X-cut plate and the longitudinal direction of the resonator chip is inclined about fifty degrees with respect to the Y-axis of the wafer. By such an arrangement, the temperature characteristic is upgraded and the equivalent series resistance is lowered, so that the stability and the energy efficiency of the piezoelectric resonator can be upgraded. Such a lithium tantalate strip type resonator element can be very effectively used in an apparatus which exchanges data or signals with another apparatus, and the data or signals can be reliably introduced into the apparatus even though the two apparatuses are disposed in a different temperature environment, since the resonator of one apparatus is strictly synchronized with the resonator of the other apparatus due to the very stable temperature characteristic of that piezoelectric resonator. However, the productivity of the lithium tantalate resonator chip is limited, since a large size lithium tantalate crystal body cannot be obtained due to its crystal characteristic, which limits the size of the wafer to under approximately 3 inches.

Lithium niobate is known as a piezoelectric material with a higher electro-mechanical coupling coefficient than lithium tantalate. However, the temperature characteristic of lithium niobate is not stable when compared with lithium tantalate, and lithium niobate has not been used as a piezoelectric resonator chip material since the resonance frequency changes in response to temperature changes. At present, there are various electronic apparatuses which comprise an electronic control circuit using a microcomputer for controlling the apparatus individually. The oscillator used in such a control circuit need not be synchronized with another oscillator, since the circuit controls only the apparatus in which the circuit is housed and does not exchange data or signals with another apparatus. The parts of the apparatus are controlled by the control circuit having one oscillator as a mono source of clock signals. Such an oscillator does not require a highly stable temperature characteristic since it does not communicate with other apparatuses and a change of frequency of the clock signals does not affect the operation of the apparatus since all of the parts are controlled based on the mono source of the clock signals. Therefore, a small size oscillator having a high energy efficiency, but without the necessity of a stable temperature characteristic is now in demand.

SUMMARY OF THE INVENTION

In accordance with the foregoing, in the present invention, a piezoelectric resonator comprising a resonator chip of lithium niobate is provided for satisfying the above-mentioned oscillator requirements. In accordance with the present invention, the cutting direction of the wafer surface cut from the lithium niobate crystal body and the cutting direction of the resonator chip cut from the wafer are considered with respect to the crystal axes (X-axis, Y-axis, and Z-axis), so that a high quality piezoelectric resonator can be obtained.

According to the present invention, there is provided a piezoelectric resonator comprising a strip type resonator chip using a lithium niobate single crystal as the resonator chip material. Each of the opposed main surfaces of the resonator chip is arranged to be a surface of a rotated Y-cut plate which is rotated 165±5 degrees about the X-axis, and the angle of the longitudinal direction of the resonator chip is arranged to be 90±5 degrees with respect to the X-axis of the rotated Y-cut plate.

BRIEF DESCRIPTION OF THE DRAWINGS

The present invention is described in detail hereinafter with reference to the drawings, in which:

FIGS. 10 to 14 are graphical views of the resonance intensity of the rotated Y-cut plates of different rotated angles with respect to the frequency;

DESCRIPTION OF THE PREFERRED EMBODIMENTS

Figure 1:
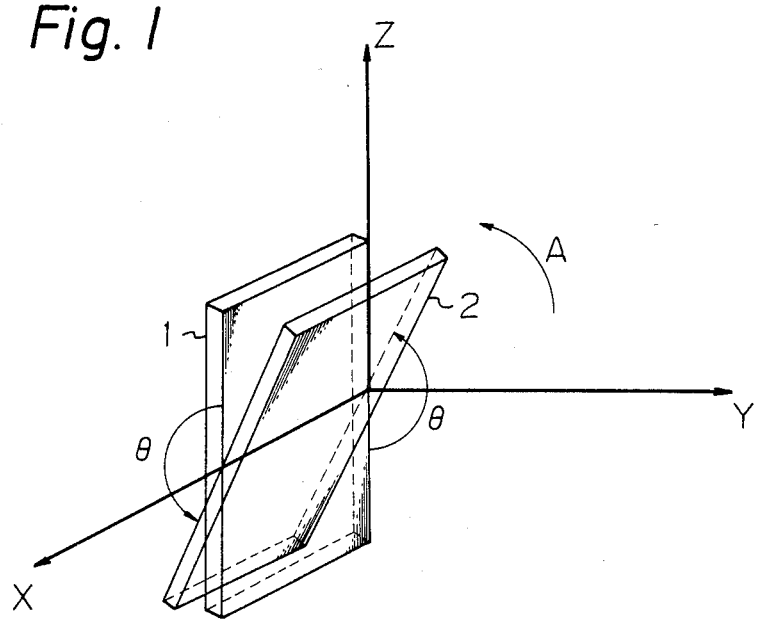
FIG. 1 is an explanatory view of the rotated Y-cut plate of the present invention.
Figure 2:
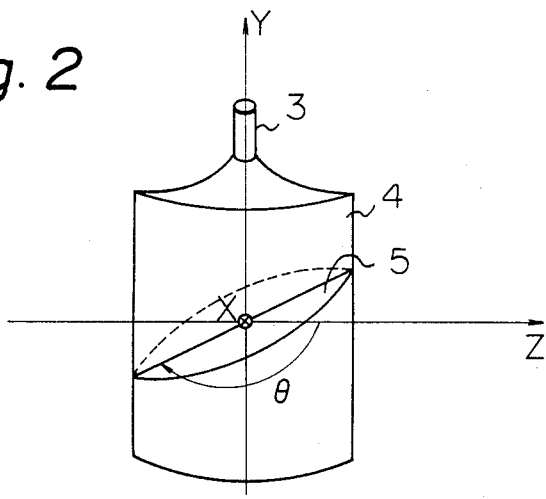
FIG. 2 is an outer view of the lithium niobate crystal body used in the present invention.

A Y-cut plate 1 cut from the lithium niobate single crystal is illustrated in FIG. 1. As shown in FIG. 1, the opposite two main surfaces of the Y-cut plate 1 are perpendicular to the Y-axis of the crystal. The rotated Y-cut plate 2 used in the present invention is defined as the plate made by rotating the Y-cut plate 1 about the X-axis by angle $\theta$ in the direction of an arrow A (from Y-axis toward Z-axis). Such a rotated Y-cut plate 2 is obtained by cutting a lithium niobate crystal body 4 as illustrated in FIG. 2. The crystal body 4 is formed around a seed crystal 3 due to the crystal growth of lithium niobate in the form of a cylindrical shape in a melting pot containing a lithium niobate solution by rotating and pulling the seed crystal out of the melting pot. The crystallographic direction of the crystal body 4 is determined according to that of the seed crystal 3. If the Y-axis is disposed vertically, as illustrated in FIG. 2, the rotated Y-cut plate 2 of FIG. 1 can be obtained by cutting the crystal body 4 along a cutting plane 5 which is inclined by $\theta$ degrees with respect to the Z-axis, so that the cutting plane 5 is arranged to be a main surface of the rotated Y-cut plate 2. The crystallographic direction of the seed crystal can be otherwise arranged so that a desired rotated Y-cut plate is obtained by cutting the crystal body perpendicularly to its vertical axis.

The lithium niobate crystal body is large, when compared with the lithium tantalate crystal body, and a wafer four inches in diameter can be made therefrom so that mass production of the resonator chips can be achieved with a decrease in costs.

Figure 3:
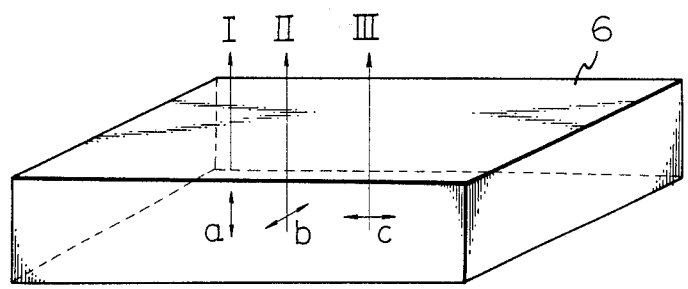
FIG. 3 is an explanatory view of the oscillation displacement direction with respect to the resonator chip in accordance with the present invention.

The optimum rotated angle $\theta$ of the rotated Y-cut plate of lithium niobate is now considered. Oscillation modes of the lithium niobate resonator chip 6 are illustrated in FIG. 3. A longitudinal mode I is a longitudinal wave which oscillates in the wave propagation direction (perpendicular to the main surface of the resonator chip 6), as shown by a double-headed arrow a. A thickness shear slow mode II is a transverse wave which oscillates perpendicularly to the wave propagation direction and laterally with respect to the resonator chip 6, as shown by a double-headed arrow b. A thickness shear fast mode III is a transverse wave which oscillates perpendicularly to the wave propagation direction and longitudinally with respect to the resonator chip 6, as shown by a double-headed arrow c. The piezoelectric resonator utilizes only the thickness shear fast mode III as the resonance oscillation. Therefore, the oscillations of the longitudinal mode I and the thickness shear slow mode II should be minimized.

Figure 4:
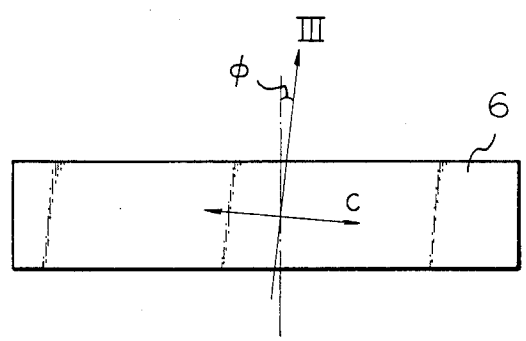
FIG. 4 is another explanatory view of the oscillation displacement direction.

If the oscillation displacement direction (arrow c) of the thickness shear fast mode III is inclined at an angle of $\phi$ degree with respect to the main surface of the resonator chip 6, the propagation direction of the wave of this mode III is also inclined at an angle of $\phi$ degree with respect to the perpendicular of the resonator chip 6, as illustrated in FIG. 4. In such a situation, the wave reflected on the chip surface adversely interferes with the wave propagating within the chip, so that a stable resonance oscillation cannot be efficiently obtained. Therefore, the angle of the oscillation displacement direction of the thickness shear fast mode III should be zero with respect to the main surface of the resonator chip 6.

Figure 5:
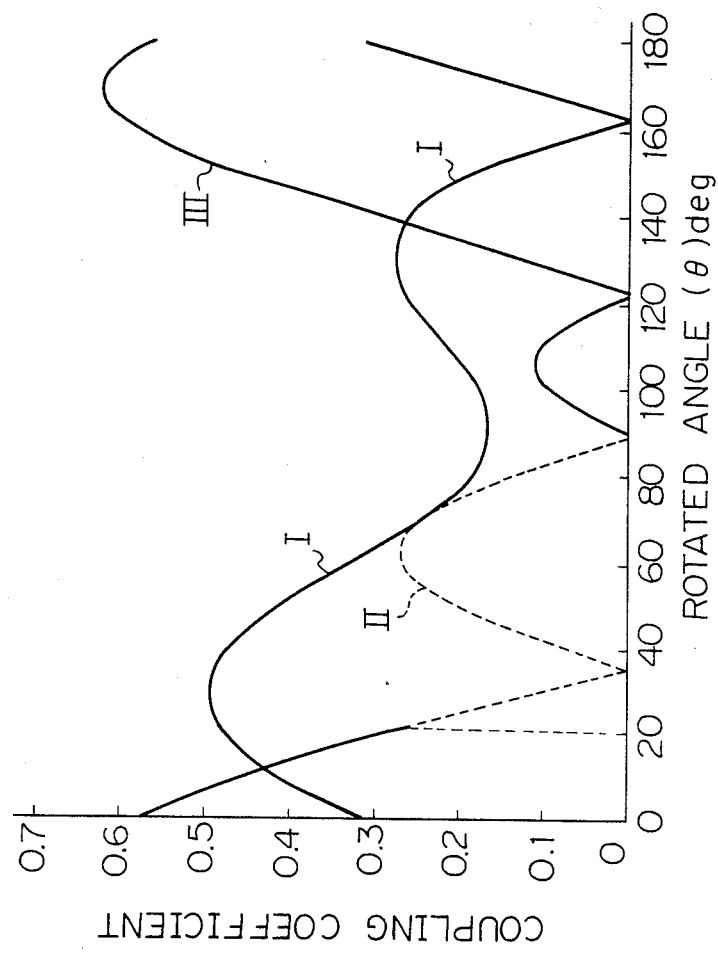
FIG. 5 is a graphical view of the coupling coefficient for various oscillation modes with respect to the rotated angle of the Y-cut plate.

The coupling coefficient of each oscillation mode is graphically shown in FIG. 5 with respect to the rotated angle $\theta$ of the rotated Y-cut plate. The graph in FIG. 5 was obtained on the basis of the results of mathematical calculation. As can be seen, the oscillation intensity is small when the coupling coefficient is small, and the oscillation intensity is enhanced as the coupling coefficient increases. As shown in FIG. 5, the coupling coefficient of the oscillation of the longitudinal mode I is zero when $\theta$=about 163°. When the angle $\theta$ is within a range between 160° and 170°, the coupling coefficient of the longitudinal mode I is below 0.1, which is an allowable value, so that the longitudinal mode I does not affect the resonance oscillation of the resonator. Also, at the angle $\theta$ within this range, the coupling coefficient of the thickness shear slow mode II is zero, and the coupling coefficient of the thickness shear fast mode III is large (more than 0.5). Therefore, when $\theta$=165±5 degrees, the mechanical oscillation of the resonator in response to the electric signal is such that the longitudinal mode I and the thickness shear slow mode II are zero or negligible, while the thickness shear fast mode III is enhanced.

Figure 6:
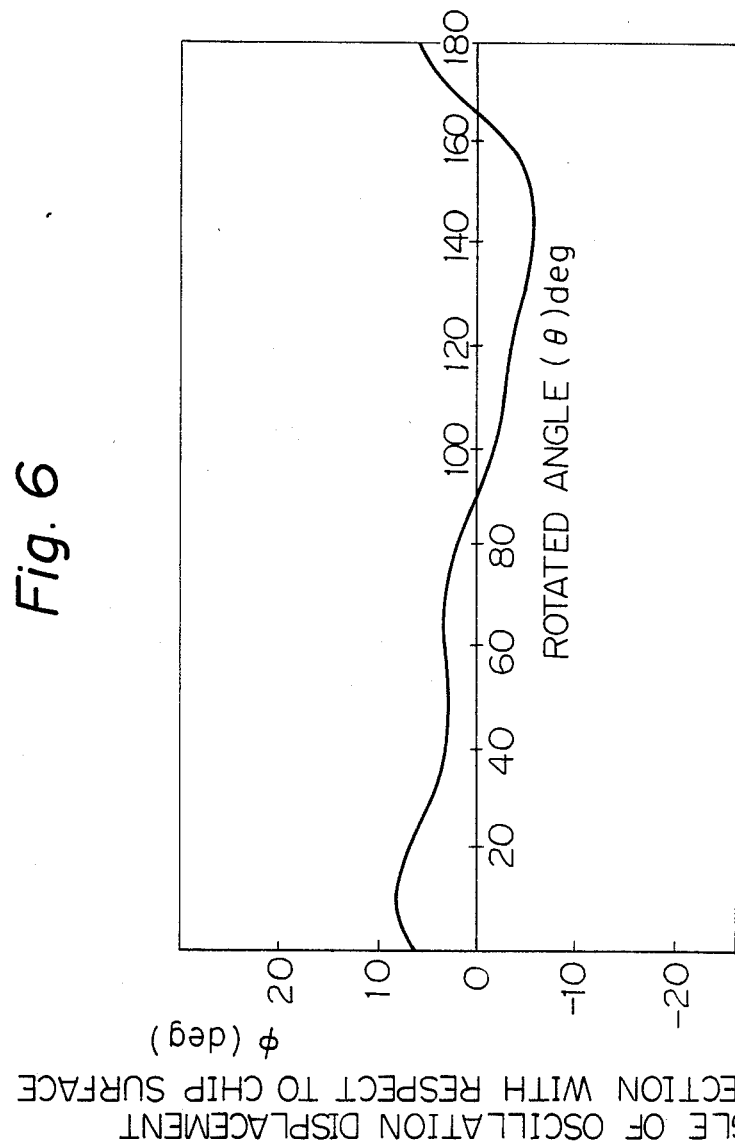
FIG. 6 is a graphical view of the angle of direction of oscillation displacement with respect to the chip surface in relation to the rotated angle of the Y-cut plate.

The angle $\phi$ of the oscillation displacement direction of the thickness shear fast mode III is graphically shown in FIG. 6 with respect to the rotated angle $\theta$ of the rotated Y-cut plate. The graph of FIG. 6 was obtained on the basis of the results of mathematical calculation. As can be seen from FIG. 6, $\phi$=0 at $\theta$=90 degrees and 165 degrees.

Considering both FIGS. 5 and 6, a stable and efficient single mode oscillation can be obtained by arranging the rotated angle $\theta$ to be 165±5 degrees.

The mathematical theory of calculation for obtaining the graphs of FIGS. 5 and 6 is briefly described hereinafter.

Figure 25:
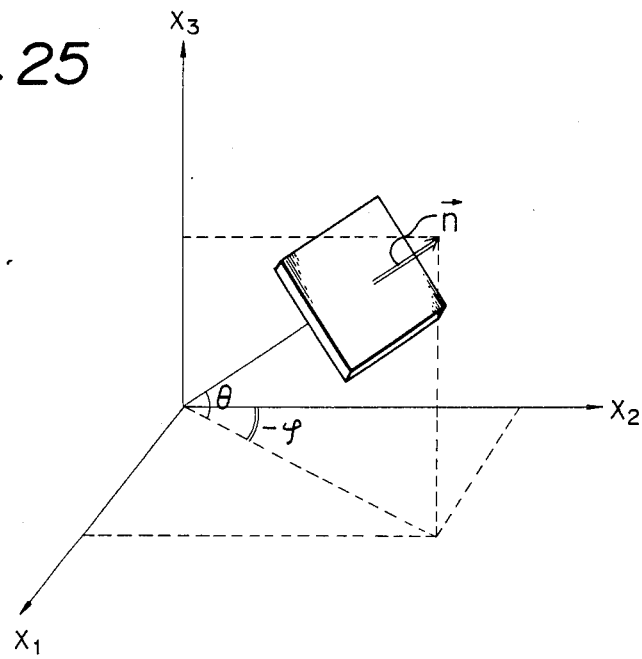
FIGS. 25 and 26 are explantory views of the mathematical theory of the present invention.

In the coordinate system of FIG. 25, the unit vector $\vec{n}$ is perpendicular to the plate illustrated in the drawing. The vector $\vec{n}$ is represented in polar coordinates as follows.

$$\vec{n} = \begin{pmatrix} n_1 \\ n_2 \\ n_3 \end{pmatrix} = \begin{pmatrix} -\sin\phi \cdot \cos\theta \\ \cos\phi \cdot \cos\theta \\ \sin\theta \end{pmatrix} \quad (1)$$

Figure 26:
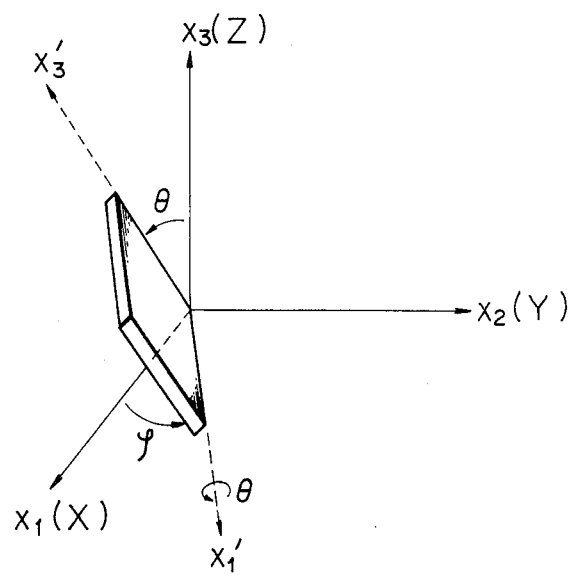

The coordinate axes $x_1$, $x_2$, and $x_3$ correspond to the crystal axes X, Y, and Z, respectively, as illustrated in FIG. 26. The aforementioned three modes of wave which oscillate in the directions perpendicular to each other are generated by applying an electric field perpendicularly to the plate of FIG. 25. These three modes are determined by solving the following characteristic equations.

$$\vec{N}\,\overline{\overline{C}}\,\vec{N_t}\,\vec{\beta} = C\vec{\beta} \tag{2}$$

$$\overline{\overline{C}} = \vec{C} + \frac{1}{\epsilon_n}(\vec{n_t}\,\vec{e})_t(\vec{n_e}\,\vec{e}) \tag{3}$$

$$\epsilon_n = \vec{n_t}\,\vec{\epsilon}\,\vec{n} \tag{4}$$

$$\vec{N} = \begin{vmatrix} n_1 & 0 & 0 & 0 & n_3 & n_2 \\ 0 & n_2 & 0 & n_3 & 0 & n_1 \\ 0 & 0 & n_3 & n_2 & n_1 & 0 \end{vmatrix} \tag{5}$$

The matrix with a suffix t is a transposed matrix; C is an eigen value; $\vec{\beta}$ is an eigen vector; $\overline{\overline{C}}$ is an elastic constant considering a piezoelectric term; $\overline{\overline{\epsilon}}$ is a dielectric constant; and e is a piezoelectric constant. The equation (2) gives three real number eigen values $C^{(1)}$, $C^{(2)}$, and $C^{(3)}$, and three corresponding eigen vectors $\vec{\beta}^{(1)}$, $\vec{\beta}^{(2)}$, and $\vec{\beta}^{(3)}$.

The coupling coefficient $k^{(i)}$ is determined from the above characteristic values as follows.

$$k^{(i)} = \frac{e^{(i)}}{\sqrt{\epsilon_n C^{(i)}}} \quad (i = 1, 2, 3) \tag{6}$$

$e^{(i)}$ is a piezoelectric constant in the direction of the main axis.

$$e^{(i)} = \beta_t^{(i)}\vec{N}\vec{e}_t\vec{n} \tag{7}$$

The oscillation displacement direction is represented by the eigen vector $\vec{\beta}^{(i)}$.

Figure 7:
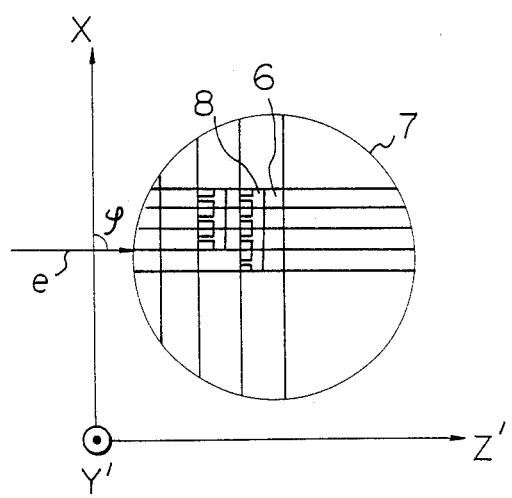
FIG. 7 is an explanatory view of the cutting direction of the resonator chip cut from the wafer with respect to the crystal axes.
Figure 8:
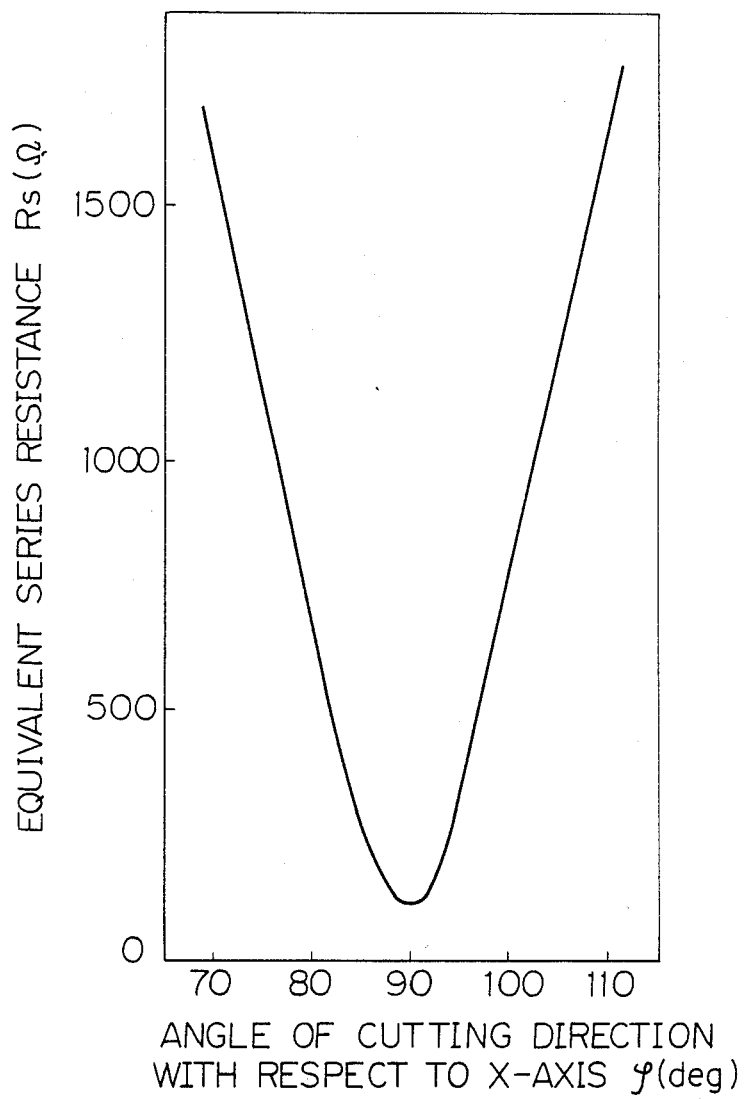
FIG. 8 is a graphical view of the equivalent series resistance of the resonator chip with respect to the angle of cutting direction thereof.

In FIG. 7, a wafer 7 is made of the rotated Y-cut plate rotated 165±5 degrees about X-axis and cut from the lithium niobate crystal body of FIG. 2. A number of rectangular piezoelectric resonator chips 6 are cut from the wafer 7. Electrodes 8 are formed on the upper and lower surfaces of the wafer 7 corresponding to the resonator chips 6 before cutting the wafer 7. Each electrode 8 is formed in the center portion of each resonator chip 6 covering the entire width thereof so as to constitute a strip type resonator. The relationship between angle $\phi$ and the equivalent series resistance $R_s$ ($\Omega$) represented in FIG. 8, in which the angle $\phi$ represents the angle between the X-axis and the cutting direction e along which each resonator chip 6 is cut in its longitudinal direction, as illustrated in FIG. 7. As can be seen from FIG. 8, the equivalent series resistance $R_s$ is minimized when $\phi = 90°$, where the electric energy is most efficiently utilized to generate resonance oscillation. Therefore, it is desirable to cut the resonator chip in its longitudinal direction along the cutting line which is perpendicular to the X-axis of the wafer so as to minimize the equivalent series resistance and obtain a piezoelectric resonator with high energy efficiency.

Figure 9:
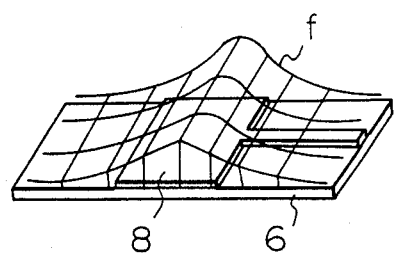
FIG. 9 is an explanatory view of the energy distribution on the resonator chip of the present invention.

The distribution of the trapped energy by the above-mentioned resonator chip 6 is illustrated by lines f in FIG. 9. The trapped energy is constant in the lateral direction of the resonator chip, maximum in the center portion in the longitudinal direction of the resonator chip, and decreases toward the ends thereof. Therefore, the resonator chip 6 can be held at both ends thereof without affecting the oscillation generated within the resonator chip. Also, almost the entire area of the chip surface is effectively used as an energy trapping area, which makes it possible to realize a small size resonator.

FIGS. 10 to 14 show the resonance characteristic (admittance) of the strip type piezoelectric resonator comprising a resonator chip having the 165±5 degree rotated Y-cut plate and having a different angle $\phi$ (FIG. 7) of the longitudinal cutting direction with respect to the X-axis. FIGS. 10 to 14 represent graphs of the resonance characteristic when the angle $\phi$ is 90°, 85°, 95°, 80°, and 100°, respectively.

FIG. 10 represents a graph of the resonance characteristic when $\phi = 90°$. An intensified resonance oscillation peak (g) is generated at a frequency of about 4.4 MHz. There are no spurious responses due to the oscillations of other than the thickness shear fast mode, around the peak (g). Therefore, the high grade resonance oscillation is obtained.

FIG. 11 is a graph of the resonance characteristic when $\phi = 85°$. Small spurious waves (h) appear in the graph. However, these spurious waves (h) are remote from the resonance oscillation peak (g) and do not affect the resonance oscillation. Therefore, the high grade resonance oscillation is also obtained as shown in FIG. 10.

Figure 12:
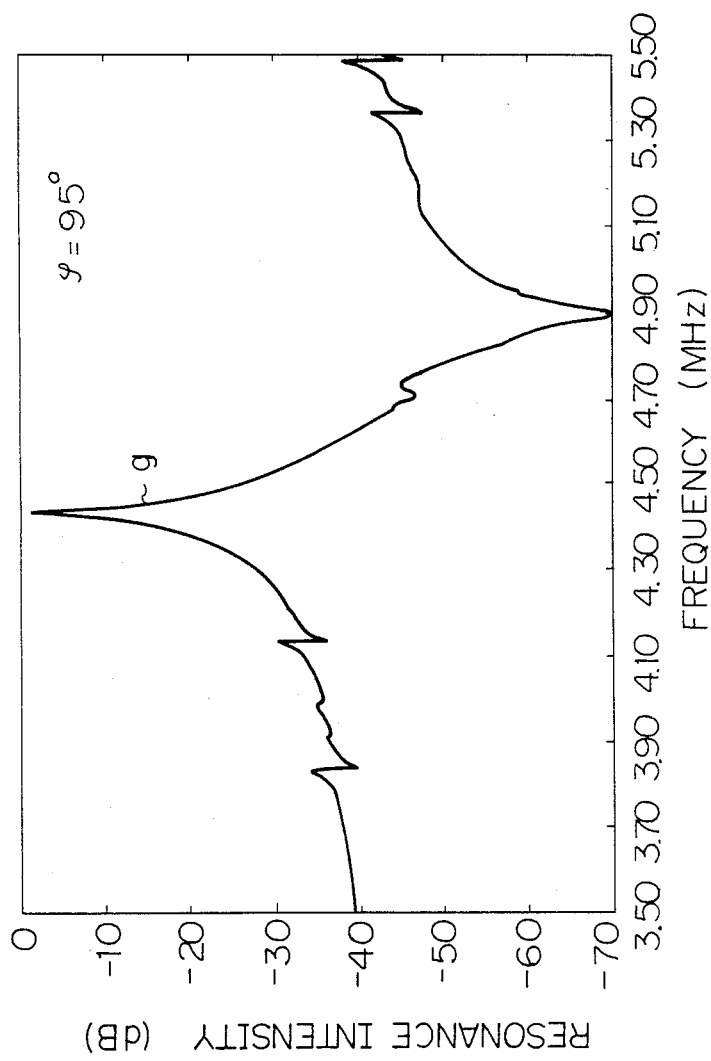

FIG. 12 is a graph of the resonance characteristic when $\phi = 95°$. Similar to the case of FIG. 11, the high grade resonance oscillation is obtained.

Figure 13:
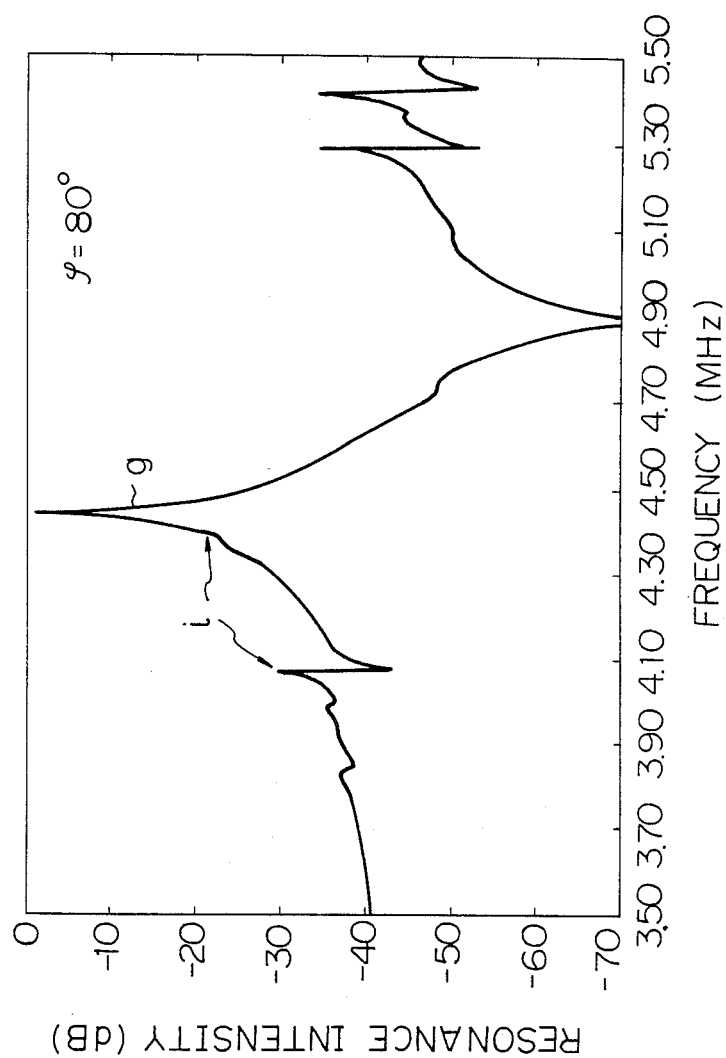

FIG. 13 is a graph of the resonance characteristic when $\phi = 80°$. Intensified spurious waves (i) appear near the resonance oscillation peak (g). Therefore, the resonance oscillation is degraded.

Figure 14:
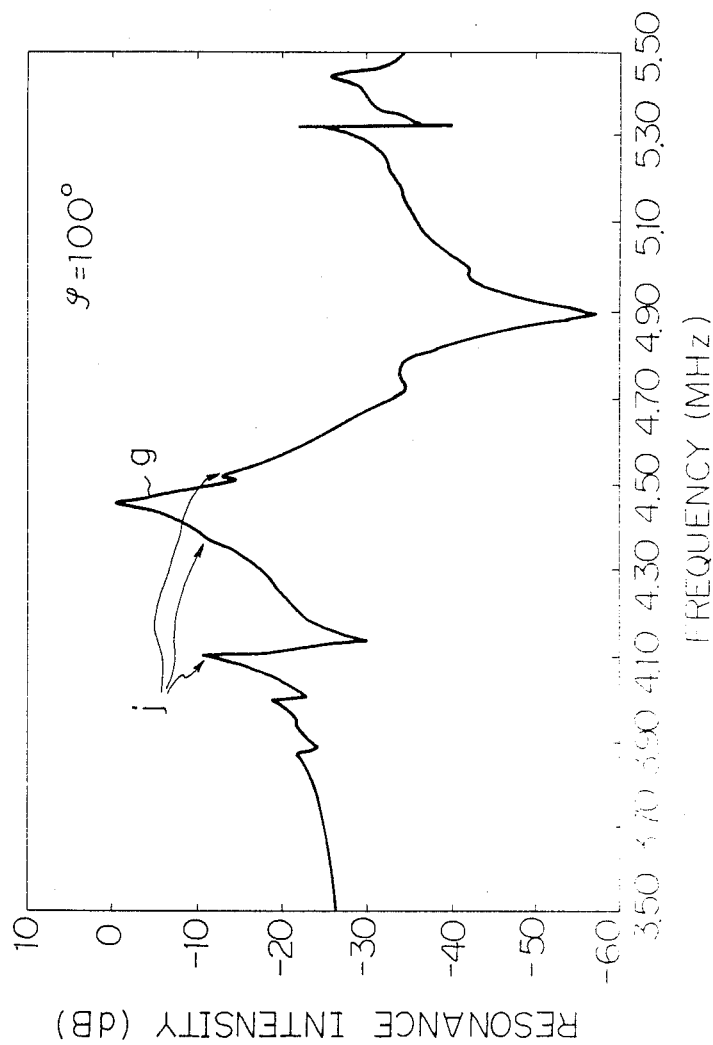

FIG. 14 is a graph of the resonance characteristic when $\phi = 100°$. Intensified spurious waves (j) appear near the resonance oscillation peak (g). Therefore, the resonance oscillation is degraded, as in the case of FIG. 13.

As can be seen from FIGS. 10 to 14, it is desirable to arrange the angle $\phi$ of the longitudinal direction of the resonator chip with respect to the X-axis to be 90±5 degrees, to obtain a piezoelectric resonator of an upgraded resonance characteristic.

Figure 15:
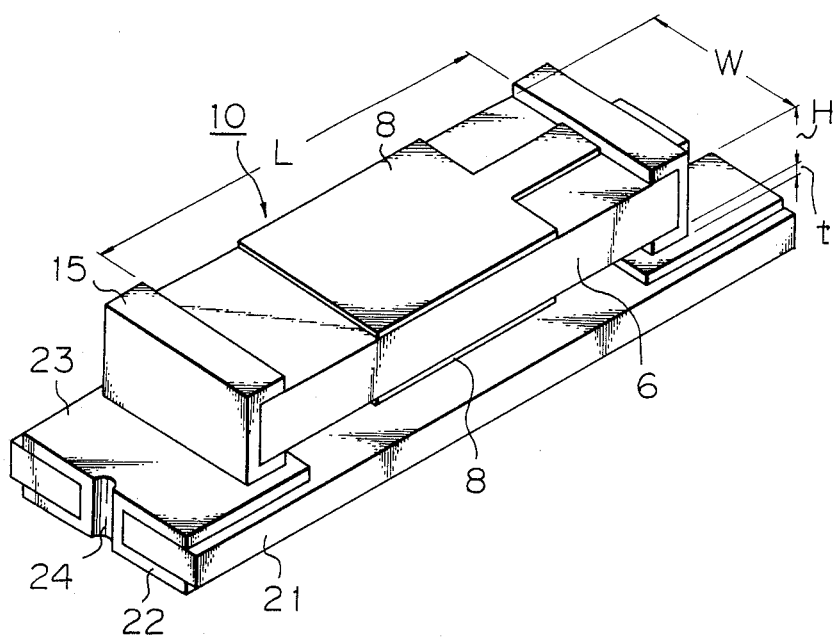
FIG. 15 is a perspective view of the strip type piezoelectric resonator in accordance with the present invention.

A strip type piezoelectric resonator comprises a strip type resonator element 10 and a base plate 21 for supporting the resonator element 10, as illustrated in FIG. 15. The resonator element 10 comprises a piezoelectric resonator chip 6 cut from a lithium niobate 165±5 degree rotated Y-cut plate, an electrode 8 of, e.g., gold, formed on each of the upper and lower surfaces of the resonator chip 6, and a terminal electrode 15 made of, e.g., a conductive paste, and disposed at each end of the resonator chip 6. One of the electrodes 8 is electrically connected to one of the terminal electrodes 15 and the other electrode 8 is electrically connected to the other terminal electrode 15.

The base plate 21 is made of, e.g., ceramic having a similar thermal expansion coefficient as that of the piezoelectric resonator chip 6. An upper electrode 23 of thick film and a lower electrode 22 of thick film are formed on the upper and the lower surfaces of each end of the base plate 21 for connection with an outer device or circuit. The upper electrode 23 and the lower electrode 22 are electrically connected by a through-hole plate 24. The terminal electrode 15 of the resonator chip 6 is electrically connected and mechanically secured to the upper electrode 23 of the base plate 21 by a conductive paste.

Figure 16:
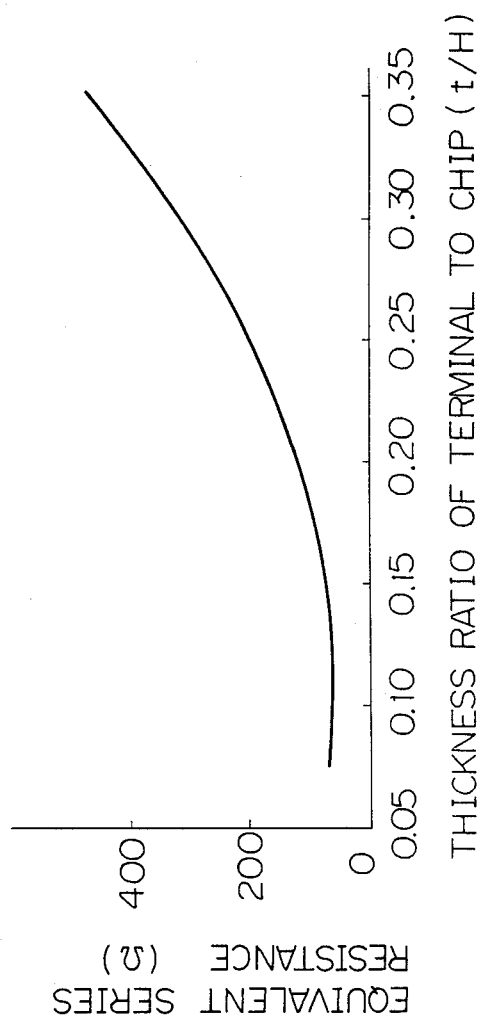
FIG. 16 is a graphical view representing the equivalent series resistance of the resonator chip with respect to the ratio of the terminal thickness to the chip thickness.

FIG. 16 is a graph of the relationship between the equivalent series resistance $R_s$ and the ratio of the thickness t of the terminal electrode 15 to the thickness H of the resonator chip 6. The graph shown that when the ratio t/H exceeds about 0.25, the equivalent series resistance $R_s$ increases too much to efficiently operate in actual size. Also, if the ratio t/H increases, a stable equivalent series resistance is not obtained. Therefore, it is desirable that the ratio t/H is below 0.25, to obtain an allowable equivalent series resistance.

Figure 17:
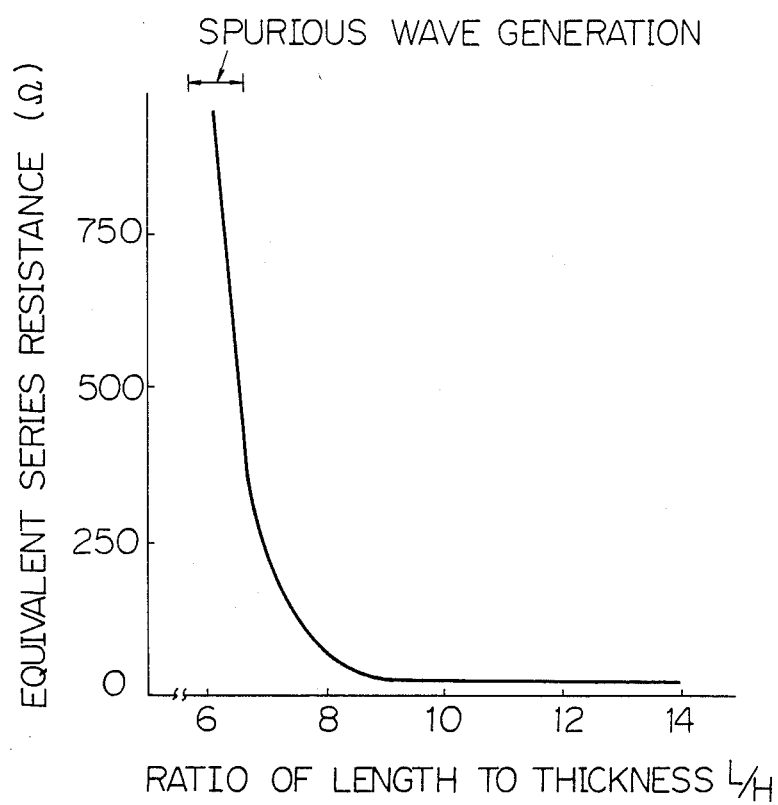
FIG. 17 is a graphical view of the equivalent series resistance of the resonator chip with respect to the ratio of the length to the thickness of the resonator chip.

FIG. 17 is a graph of the relationship between the equivalent series resistance $R_s$ and the ratio of the length L of the resonator chip 6 to the thickness H thereof. As can be seen from the graph, if the ratio L/H decreases below 8, the equivalent series resistance $R_s$ steeply rises. Also, in the range of high equivalent series resistance, spurious waves appear, which degrade the resonance oscillation characteristic. Therefore, it is desirable that the ratio L/H is more than 8, to obtain a resonator chip of a low equivalent series resistance and a high grade resonance oscillation characteristic.

Figure 18:
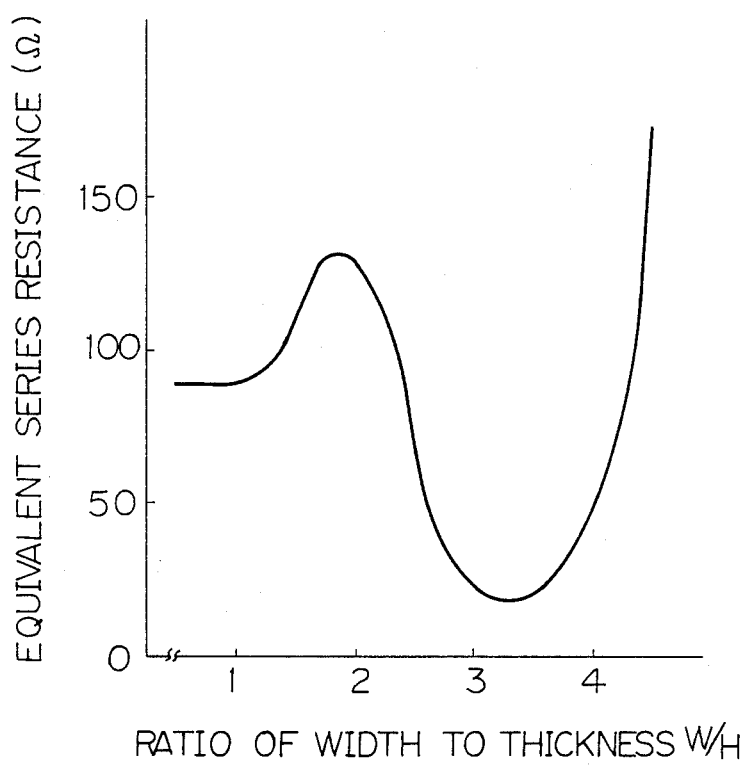
FIG. 18 is a graphical view of the equivalent series resistance of the resonator chip with respect to the ratio of the width to the thickness of the resonator chip.

FIG. 18 is a graph of the relationship between the equivalent series resistance $R_s$ and the ratio of the width W of the resonator chip 6 to the thickness H thereof. It can be seen from the graph that the equivalent series resistance is low when the ratio W/H is below 1.3 or between 2.5 and 4.3. Therefore, it is desirable that the ratio W/H is below 1.3 or between 2.5 and 4.3, to obtain a resonator chip of low equivalent series resistance.

Figure 19:
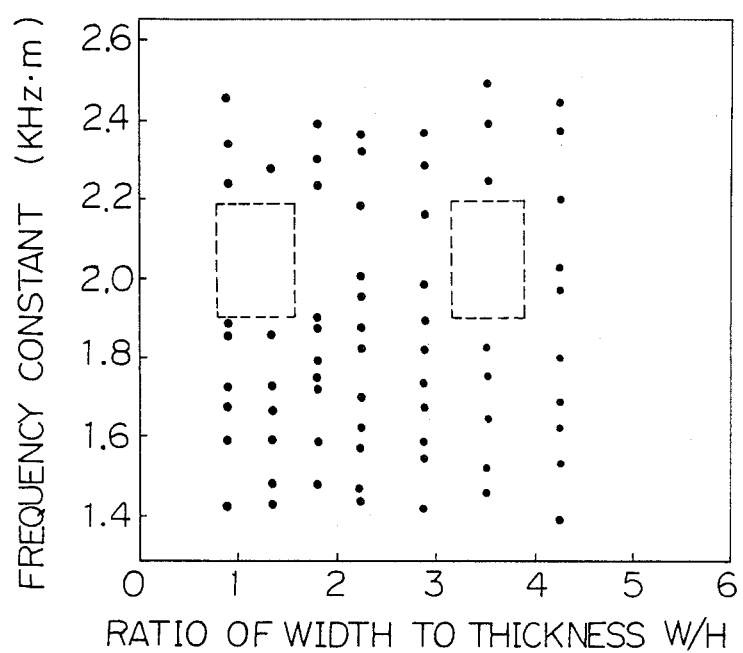
FIG. 19 is a graphical view of the spurious wave spectrum with respect to the ratio of the width to the thickness of the resonator chip.

FIG. 19 is a frequency spectrum graph of spurious waves. The abscissa represents the ratio W/H and the ordinate represents the frequency constant (KHz.m). Each dot of the graph respresents the generation point of a spurious wave. The spurious waves should not be generated at the level of frequency constant of about 2.0, since the resonance oscillation peak appears at that level. In the areas that are surrounded by a dash line, i.e., when the ratio W/H is between about 0.9 and 1.6 or about 3.2 and 3.8, no spurious waves appear and a high grade single mode resonance oscillation can be obtained.

Figure 20:
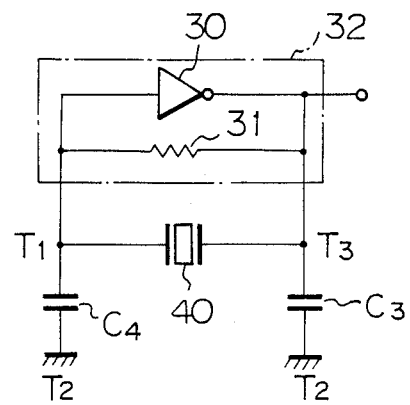
FIG. 20 is an example of a circuit diagram in which the piezoelectric resonator of the present invention is used.
Figure 21:
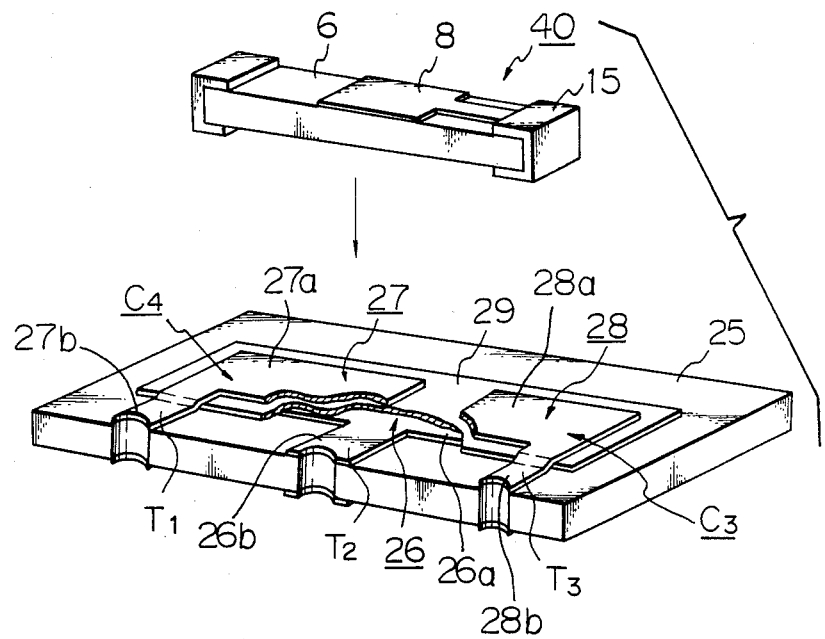
FIG. 21 is a perspective view of the strip type piezoelectric resonator to be assembled with two capacitors.
Figure 22:
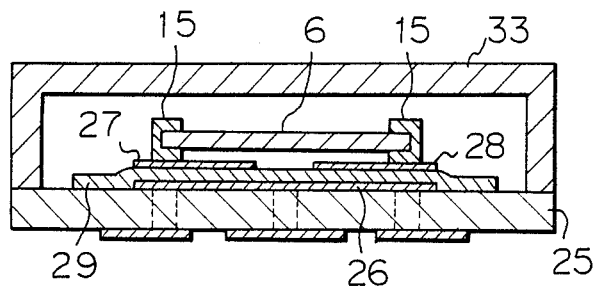
FIG. 22 is a sectional view of the strip type piezoelectric resonator assembled with two condensers.
Figure 23:
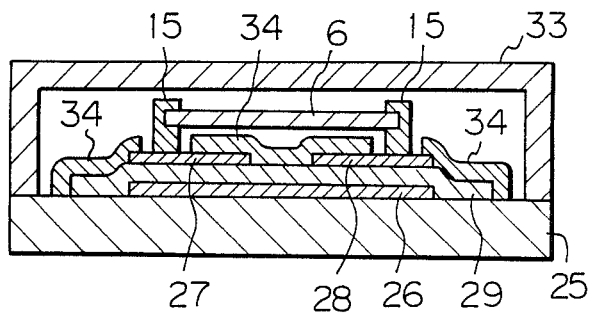
FIG. 23 is a sectional view of another of the strip type piezoelectric resonators assembled with two capacitors.
Figure 24:
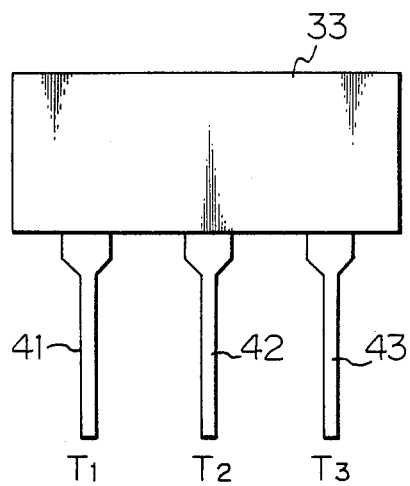
FIG. 24 is an outer view of an electronic device housing the piezoelectric resonator of the present invention therein.

An example of an electric circuit diagram including the strip type resonator element 40 using the lithium niobate single crystal is illustrated in FIG. 20. The strip type resonator element 40 is combined with two capacitors $C_3$ and $C_4$ so that it is electrically connected to and disposed between the two capacitors in series, and used as a device for generating clock signals for a microcomputer circuit comprising an inverter 30 and a resistance 31. Such an arrangement of the piezoelectric resonator has been increasingly used in actual practice. Therefore, it is convenient to embody the circuit if the piezoelectric resonator 40 and the two capacitors $C_3$ and $C_4$ are assembled together to constitute a single electronic device. Such an assembled electronic device is illustrated in FIG. 21. A T-shaped lower electrode layer 26 is formed on a ceramic base plate 25. The lower electrode layer 26 comprises an electrode portion 26a and a lead terminal portion 26b($T_2$). A dielectric layer 29 is formed on the electrode portion 26a of the lower electrode layer 26. Two upper electrode layers 27 and 28 are formed on the dielectric layer 29 and constitute two film type capacitors $C_3$ and $C_4$. Each terminal electrode 15 of the strip type resonator element 40 is secured to each of the upper electrode layers 27 and 28 of the capacitors $C_3$ and $C_4$. Each upper electrode layers 27, 28 comprises an electrode portion 27a, 28a and a lead terminal portion 27b($T_1$), 28b($T_3$). $T_1$, $T_2$, and $T_3$ designate terminals of the device and correspond to the points illustrated in FIG. 20. The terminal $T_2$ is used as a ground terminal. The terminals $T_1$ and $T_3$ are used as signal terminals. The lead terminal portions 26b, 27b, 28b extend toward one edge of the base plate 25. The assembled device of the piezoelectric resonator and the capacitors is sealed with a cap 33, as illustrated in FIG. 22, and forms a single electronic device. FIG. 23 shows another example of the assembled electronic device in which the moisture-proof ability is improved. Exposed portions of the dielectric layer 29 are covered with a moisture-proof insulation 34 such as a glass paste or a resist agent, so that the characteristic of the capacitors is stabilized irrespective of change in ambient moisture, and the reliability of the assembled device is upgraded. FIG. 24 is an outer view of the assembled device of the strip type resonator element and two capacitors. Terminals 41, 42, 43 of the device are connected to the lead terminal portions 27b, 26b, 28b, respectively, within the cap 33.

We claim:

1. A piezoelectric resonator comprising;
   a rectangular parallelepiped resonator chip of a lithium niobate single crystal, wherein opposed main surfaces of said resonator chip are surfaces of a rotated Y-cut plate which is rotated 165±5 degrees about an X-axis, and the angle of the longitudinal direction of said resonator chip is arranged to be 90±5 degrees with respect to the X-axis of said rotated Y-cut plate; and
   an electrode on each said main surface of said resonator chip, at the center portion of each said main surface with respect to the longitudinal direction thereof, and covering the entire width thereof at said portion, so as to constitute a strip type resonator element;
   wherein the ratio L/H is larger than 8, in which L represents the length of said resonator chip and H represents the thickness of said resonator chip.

2. A piezoelectric resonator as set forth in claim 1, wherein the ratio W/H is less than 1.3 or between 2.5 and 4.3, in which W represents the width of said resonator chip.

3. A piezoelectric resonator as set forth in claim 2, wherein the ratio W/H is between 0.9 and 1.3 or 3.2 and 3.8.

4. A piezoelectric resonator as set forth in claim 1, wherein:
   a terminal electrode is provided at each of the longitudinal ends of said resonator chip of said strip type resonator element;
   said element is mounted on a base plate on which at least two terminals for exterior connection are provided;
   each said terminal electrode of said element is connected to a respective one of said terminals of said base plate, so as to constitute a strip type piezoelectric reconator;
   at least two capacitors are formed on said base plate so that said strip type resonator element is electrically connected in series with, and disposed between, the two capacitors; and said resonator element and said capacitors are enclosed and sealed by a cap disposed on said base plate.

5. A piezoelectric resonator as set forth in claim 4, wherein each of said two capacitors is a film type capacitor which comprises a lower electrode layer, an intermediate dielectric layer, and an upper electrode layer, said layers being superimposed on said base plate.

6. A piezoelectric resonator as set forth in claim 5, wherein each of said upper and lower electrode layers comprises an electrode portion and a lead terminal portion, with the electrode portion of the lower electrode layer being common to the two capacitors, said dielectric layer is disposed on said electrode portion of said lower electrode layer, two separated upper electrode portions are disposed on said dielectric layer, and said upper and lower electrode layers have respective lead terminal portions extending toward one edge of said base plate.

7. A piezoelectric resonator as set forth in claim 6, wherein each of the two separated upper electrode layers is used as each of said two terminals for outer connection of said base plate, so that each terminal electrode of said strip type resonator element is connected to one of the two upper electrode portions.

8. A piezoelectric resonator as set forth in claim 6 or 7, wherein said lead terminal portion of each said lower electrode layer is used as a ground terminal of the respective capacitor and said lead terminal portion of each said upper electrode layer is used as a respective signal terminal of the capacitor.

9. A piezoelectric resonator as set forth in claim 8, wherein said lead terminal portion of said lower electrode layer is disposed between the two lead terminal portions of said upper electrode layers along one edge of said base plate.

10. A piezoelectric resonator as set forth in claim 9, wherein each lead terminal portion extends to the rear side of said base plate through the side edge thereof.

11. A piezoelectric resonator as set forth in claim 10, wherein a terminal of a device including said resonator is connected to each lead terminal portion of the capacitors.

12. The resonator of claim 4, wherein the ratio W/H is less than 1.3 or between 2.5 and 4.3, in which W represents the width of said resonator chip.

13. The resonator of claim 4, wherein the ratio W/H is less than 1.3 or between 2.5 and 4.3, in which W represents the width of said resonator chip.

14. The resonator of claim 13, wherein the ratio W/H is between 0.9 and 1.3 or 3.2 and 3.8.

15. The resonator of claim 6, wherein the ratio of the thickness t of the portions of said terminal electrode between said resonator chip and said terminals for exterior connection on said baseplate, to the thickness H of the resonator, is less than about 0.25.

* * * * *

UNITED STATES PATENT AND TRADEMARK OFFICE
CERTIFICATE OF CORRECTION

PATENT NO. : 4,583,019

DATED : 15 May 1986

INVENTOR(S) : SUMIO YAMADA et al

It is certified that error appears in the above-identified patent and that said Letters Patent is hereby corrected as shown below:

In the title of the invention [54], "$LINBO_3$" should be --LINE--.

Col. 5, line 25, "e" should be --$\vec{e}$--;

Col. 5, line 38, "$\vec{N}$ $\vec{e}$ $\vec{n}$" should be --$\vec{N}$ $\vec{e}$ $\vec{N}$--.

Col. 8, line 64, "reconator" should be --resonator--.

Col. 10, claim 13, line 1, "4" should be --5--;

Col. 10, claim 15, line 1, "6" should be --4--.

Signed and Sealed this

Sixteenth Day of September 1986

[SEAL]

Attest:

DONALD J. QUIGG

Attesting Officer

Commissioner of Patents and Trademarks